United States Patent [19]
Muller et al.

[11] Patent Number: 5,776,808
[45] Date of Patent: Jul. 7, 1998

[54] PAD STACK WITH A POLY SI ETCH STOP FOR TEOS MASK REMOVAL WITH RIE

[75] Inventors: Karl Paul Muller, Wappinger Falls, N.Y.; Bernhard Poschenrieder, Saint-Cloud, France; Klaus Roithner, Wappingers Falls, N.Y.

[73] Assignees: Siemens Aktiengesellschaft, Munich, Germany; International Business Machines, Corporation, Armonk, N.Y.

[21] Appl. No.: 777,156

[22] Filed: Dec. 26, 1996

[51] Int. Cl.$^6$ .................................... H01L 21/8242
[52] U.S. Cl. ................................ 438/243; 438/386
[58] Field of Search .......................... 438/243, 244, 438/386

[56] References Cited

U.S. PATENT DOCUMENTS 5,593,912   1/1997   Rajeevakumar .................. 438/243

*Primary Examiner*—Jey Tsai
*Attorney, Agent, or Firm*—Dexter K. Chin

[57] ABSTRACT

A method for allowing the removal of a TEOS etch mask layer utilizing an anisotropic technique such as reactive ion etching. The use of the anisotropic technique results in substantially less undercutting of the pad oxide layer than wet chemical etching techniques. One embodiment of the invention involves forming a polysilicon etch stop layer under the pad TEOS layer.

30 Claims, 5 Drawing Sheets

PAD STACK WITH A POLY SI ETCH STOP FOR TEOS MASK REMOVAL WITH RIE

FIELD OF THE INVENTION

The invention relates generally to DRAM structures and more particularly to a method for substantially preventing the undercutting of the pad oxide during the removal of the TEOS mask.

BACKGROUND OF THE INVENTION

Typical dynamic random access memories (DRAMs) comprise multiple storage cells, each including a data storage capacitor and an access transistor. Such structures are used as semiconductor memories.

DRAMs are generally implemented with one of two storage cell configurations. The first storage cell configuration comprises a "multilayer" capacitor structure formed on a semiconductor substrate. The other storage cell configuration comprises a "trench" capacitor structure formed on a semiconductor substrate. Since the "trench" capacitor structure allows for the highest density of memory cells per given area of semiconductor substrate, a preference for trench DRAM cells in various micro-electronic devices has been increasing steadily in recent years.

A typical capacitance storage trench for a DRAM cell comprises a generally cylindrical-shaped trench that is etched into the surface of a semiconductor substrate. The trenches are typically created in the semiconductor substrate using a deep trench etch process such as reactive ion etching (RIE). Before etching can be performed, a multilayer mask is deposited over the semiconductor substrate and patterned to enable the trenches to be selectively created in the appropriate areas of the semiconductor substrate. This is accomplished by first depositing a pad oxide layer over the semiconductor substrate. Next, a pad nitride layer is deposited over the pad oxide layer. The mask layer is completed by depositing a pad TEOS (tetra-ethyl-orthosilicate) layer over the pad nitride layer and patterning the three pad layers using conventional techniques. The patterning of the mask layer exposes selected regions of the semiconductor substrate where the trenches are to be created. The pad TEOS serves as a RIE hard mask material for deep trench etching.

After the deep trench etch process is performed, portions of the pad nitride layer overhang the trenches and must be removed before further DRAM processing can take place. Further DRAM processing also requires the removal of the pad TEOS layer. Presently, the overhanging pad nitride portions and the pad TEOS layer are removed using two separately performed wet chemical isotropic etching procedures which produce a severe undercutting of the pad oxide and pad nitride layers.

Accordingly, there is a need for a method which allows the overhanging pad nitride portions and the pad TEOS layer to be removed without undercutting the pad oxide and pad nitride layers.

SUMMARY OF THE INVENTION

A process for removing a mask used for patterning device structures is disclosed. The process comprises providing a substrate of semiconductor material on which the device structures are formed. A mask is formed on the substrate. In accordance with the invention, the mask comprises a hard mask layer and a hard mask etch stop layer below the hard mask layer. The mask layer is patterned to define a selected region. A portion of the substrate in the selected region is removed. After the portion of the substrate is removed, an anisotropic dry process is performed to remove the portions of the hard mask layer that remains on the surface of the substrate. The anisotropic dry process, such as a reactive ion etching, is selective to the hard mask etch stop layer. In this manner, the RIE removes the hard mask layer without effectively removing the hard mask etch stop layer. The use of the RIE reduces the occurrence of undercutting in the remaining layers of the mask.

BRIEF DESCRIPTION OF THE DRAWINGS

For a detailed understanding of the present invention, reference should be made to the following detailed description taken in conjunction with the accompanying drawings wherein.

DETAILED DESCRIPTION OF THE INVENTION

The present invention relates generally to the fabrication of devices. In particular, the invention is directed to the reduction or elimination of undercutting of one of the pad layers, such as the pad oxide, that occurs during mask removal. For purposes of illustration, the present invention is described in the context of a trench capacitor device. However, the invention is significantly broader and extends to the fabrication of devices where undercutting of a pad layer adversely affects subsequent process steps.

Figure 1A:
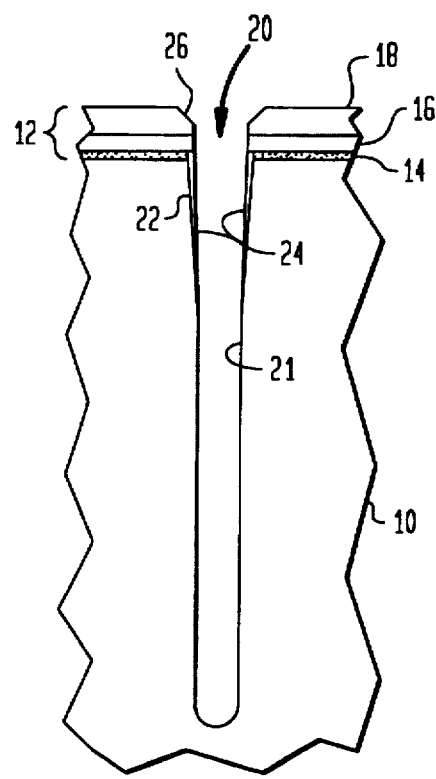
FIGS. 1A–1G are cross-sectional side views through a substrate which depict a prior art method for TEOS mask removal.

A description of conventional mask and mask removal techniques is provided before discussing the invention. Referring to FIG. 1A, a capacitance storage deep trench 20 for a DRAM cell is shown. The trench capacitor is formed by coventional patterning and etching techniques. Such techniques, for example, are described in Muller et al., *Microelectronic Engineering*, 27, p457 (1995); and Boudur et al., *Extended Abstracts*, Electrochem. Soc., Vol. 90-1 (May 1990), both herein incorporated by reference for all purposes. As shown, a conventional pad stack 12 is formed on the surface of a substrate 10. The pad stack serves as an etching mask. The mask is patterned so as to define regions wherein trenches are formed using, for example, conventional reactive ion etch (RIE) techniques.

The pad stack comprises a pad oxide layer 14, a pad nitride layer 16, and pad TEOS layer 18. The pad TEOS layer provides a hard mask for the RIE, the nitride layer serves as a polish stop for subsequent chemical mechanical polishing (CMP) step, and the pad oxide promotes adhesion of the pad nitride layer to the substrate as well as relieving stress at the interface.

As shown in FIG. 1A a sidewall passivation film 24 is built up along the upper portion 22 of the trench sidewall 21 as a result of the RIE deep trench etch process. Also, the edges of the TEOS layer defining the trench typically have a relatively higher exposure to the vertical bombardment of ions during the RIE than the planar portions of the TEOS layer. Higher exposure of ions increases the etch rate, resulting in faceted top corners 26 in the pad TEOS layer 18. Generally, the faceted top corners 26 of the pad TEOS layer 18 can be tolerated as long as the facets 26 do not reach down to the underlying pad nitride layer 16. Facets in the pad nitride layer can detrimentally affect the chemical-mechanical polishing process that takes place later on in further DRAM processing.

Figure 1B:
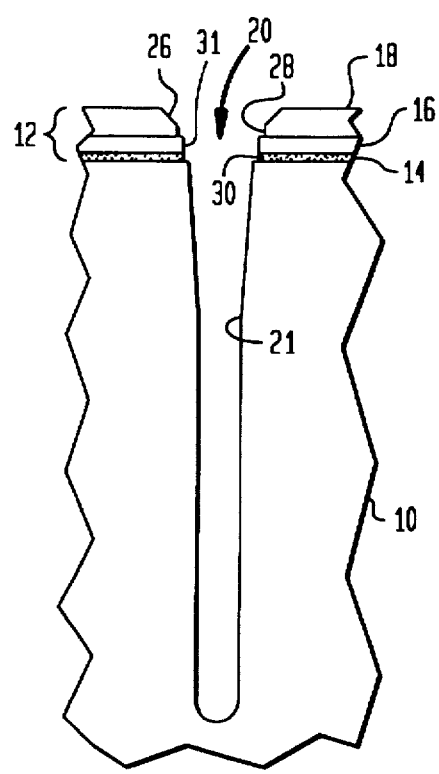

FIG. 1B, shows the capacitance storage trench 20 of FIG. 1A after the removal of the sidewall passivation film 24 and the pulling back of a portion 31 of the pad nitride layer 16 which overhangs the opening of the deep trench 20 using a wet chemical process such as a dip in a buffered solution of hydrofluoric acid. The wet chemical process also tends to pull back the pad TEOS layer 18 at edges 28 and exposes a portion of the underlying pad nitride layer 16. Moreover, since the wet chemical process is isotropic, it also undercuts the pad oxide layer 14 shown at edges 30.

Removal of the pad TEOS layer is achieved using a wet chemical process. However, since the pad nitride layer is exposed, removal of the pad TEOS undesirably causes further undercutting in the pad nitride layer. Further undercutting of the pad nitride layer leads to lifting off of the pad nitride layer and/or birds beak formation. Conventionally, undercutting of the pad nitride layer is avoided by delaying the removal of the pad TEOS layer until subsequent process steps have been completed. These subsequent process steps protect the exposed edges of the oxide layer, as will be apparent, from undercutting during an isotropic wet chemical process.

Figure 1C:
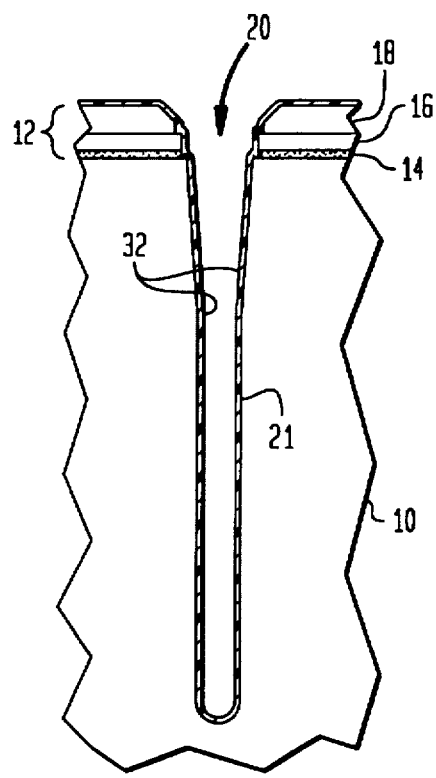
Figure 1D:
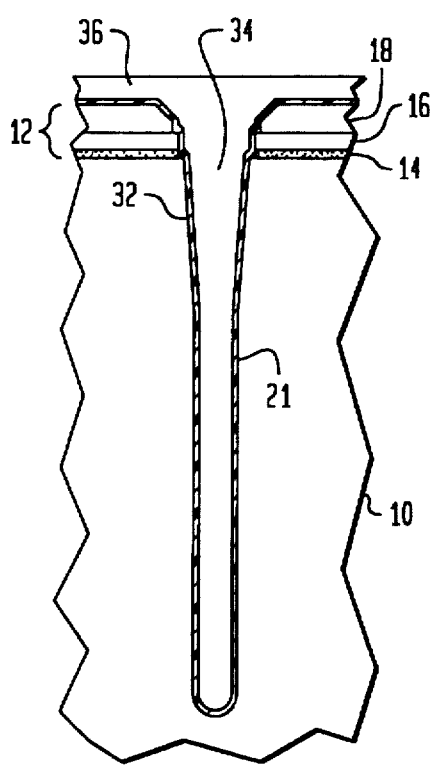

Referring to FIG. 1C, a thin dielectric film or node dielectric layer 32 is formed along the entire surface of the deep trench using conventional thermal oxidation techniques. Next, as shown in FIG. 1D, a polysilicon plug 34 is deposited using conventional techniques such as low pressure chemical vapor deposition, to fill the deep trench. The filling of the trench with polysilicon also forms a polysilicon layer 36 on the substrate surface. Finally in FIG. 1E, the surplus polysilicon layer 36 (shown in FIG. 1D) deposited during the formation of the polysilicon plug 34 from the polysilicon trench fill is removed by a chemical-mechanical polishing (CMP) step.

Figure 1E:
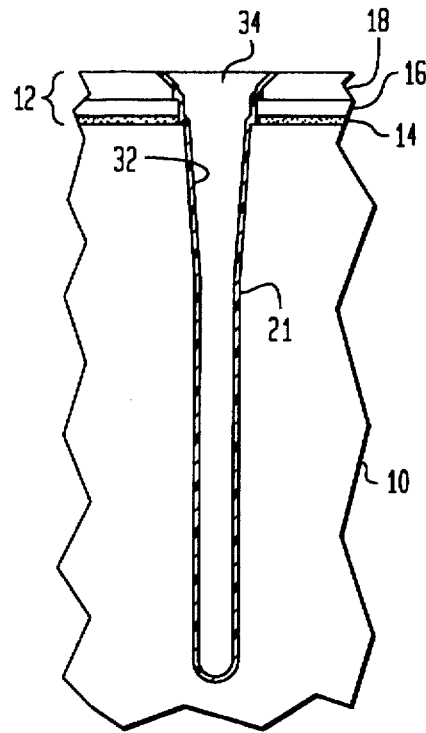
Figure 1F:
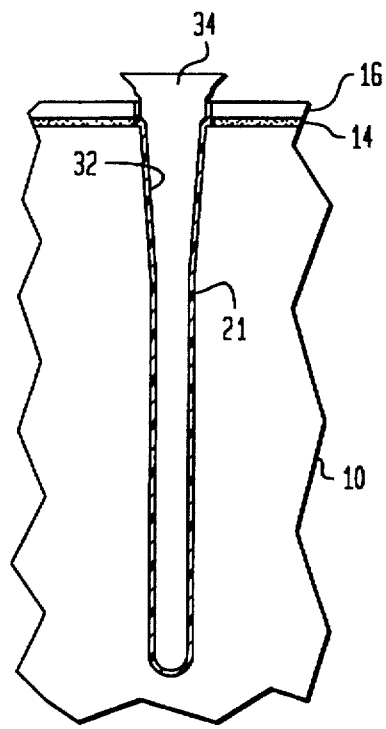
Figure 1G:
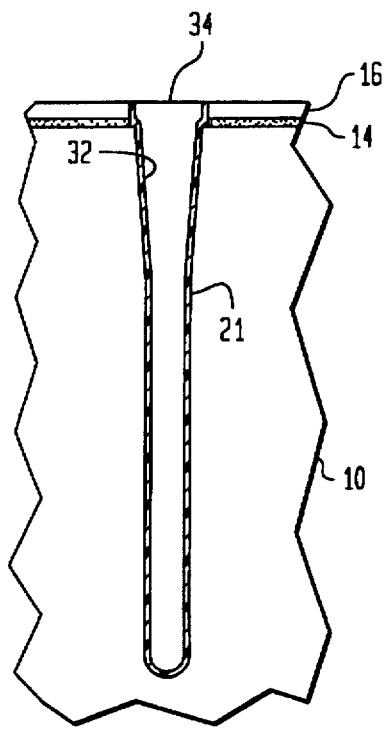

From FIG. 1E, the polysilicon plug 34 covers the pad oxide layer, thus protecting it from further undercutting caused by the wet chemical etching process. As such, removal of the pad TEOS layer 18 by a wet chemical process such as a hydrofluoric acid bath, can be achieved without detrimentally eroding the pad oxide layer. After the pad TEOS layer is removed as shown in FIG. 1F, the polysilicon plug 34 extends out over the pad nitride layer 16. Accordingly, an additional CMP touch up is performed to planarize the substrate 10 as depicted in FIG. 1G.

FIGS. 2A–2H show an embodiment of the invention. The invention enables the removal of the hard mask layer of the etch mask after formation of the deep trench without causing additional undercutting of the pad oxide layer. As previously discussed, such additional undercutting adversely affects subsequent process steps such as CMP.

Figure 2A:
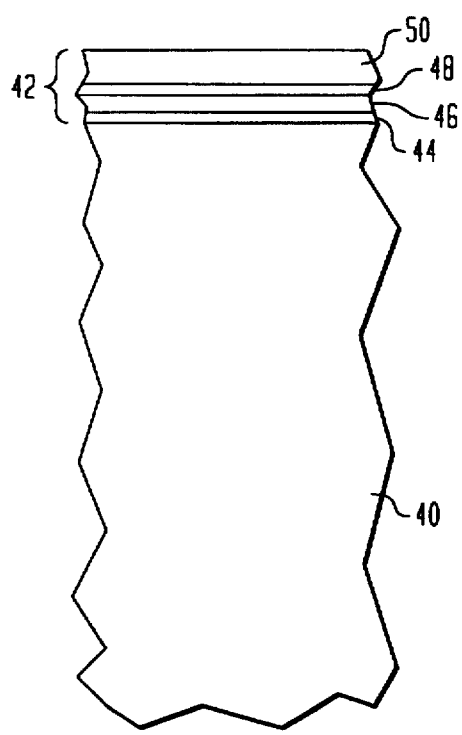
FIG. 2A is a cross-sectional side view through a substrate after depositing a pad stack with polysilicon as an etch stopper for TEOS mask removal in accordance with the invention.

Referring to FIG. 2A, a pad stack 42 formed on the surface of a semiconductor substrate 40 is shown. The pad stack serves as lithographic mask for defining and forming capacitance trench regions in the substrate. As shown, the pad stack comprises a plurality of pad films, including an adhesion promoting layer 44, a polish stop layer 46, a hard mask etch stop layer 48, and a hard mask layer 50, that are formed sequentially on the surface of the substrate. Various conventional techniques are useful for forming the pad films. These techniques, for example, include thermal oxidation and various chemical vapor deposition (CVD) techniques such as low pressure CVD (LPCVD), atmospheric-pressure (APCVD), and plasma-enhanced CVD (PECVD). Such techniques are described in Sze, *VLSI Technology*, 2nd ed., McGraw-Hill (1988), which is herein incorporated by reference for all purposes.

Illustratively, the hard mask layer comprises a TEOS layer of sufficient thickness to prevent the RIE process for forming the deep trench from eroding the TEOS so as to expose the preceding layer. Other material such as boron doped silicate glass (BSG) is also useful. Typically, the TEOS layer is about 5000–7000 angstroms (Å) thick. Beneath the hard mask layer is the hard mask etch stop layer 48. The hard mask etch stop layer enables the use of an anisotropic dry process, such as RIE. The RIE is selective to the hard mask etch stop layer, enabling the removal of the hard mask layer 50 without effectively removing the hard mask etch stop layer to prevent exposure of the preceding layers. In one embodiment, the hard mask etch stop layer comprises a layer of polysilicon having a thickness sufficient to prevent exposure of the preceding pad films during the removal of the hard mask layer 50. Typically, the thickness of the etch stop layer is about 40–60 nanometers (nm). In one experiment, about a 50 nm polysilicon etch stop layer was sufficient to prevent exposure of the preceeding pad films while removing the TEOS hardmask having a thickness of, after the RIE process for forming the deep trench, about 50–250 nm.

Alternatively, a RIE process selective to silicon nitride is performed to removed the TEOS layer. The use of the RIE selective to silicon nitride enables the pad nitride to serve as an etch stop layer during the removal of the TEOS layer, enabling the etch stop layer 48 between the TEOS layer 50 and the pad nitride layer 46 to be eliminated. As will be apparent from the subsequent description, the invention reduces the undercutting of the pad oxide layer 44 caused by conventional wet chemical process for removing of the hard mask layer 50.

The polish stop layer 46 comprises a nitride layer formed by, for example, LPCVD. The thickness of the nitride layer is sufficient to prevent a polishing step, such as CMP, from exposing the underlying layer. Typically, the thickness of the nitride layer is about 200–240 nm, preferably about 220 nm. The adhesion promoting film comprises, for example, a thermally grown pad oxide layer having a thickness of about 70–120 Å, preferably about 80 Å.

Figure 2B:
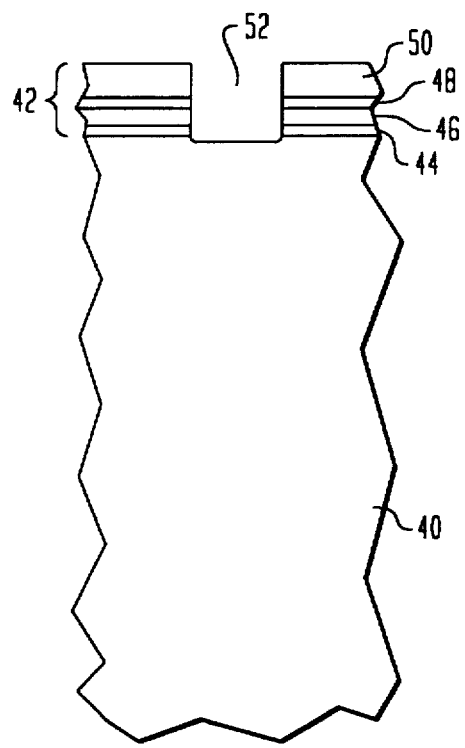
FIG. 2B is a cross-sectional side view through the substrate of FIG. 2A after patterning the pad stack.

FIG. 2B depicts the substrate 40 of FIG. 2A after patterning the mask layer 42 using conventional photolithography techniques to remove a selected area 52 of the mask layer 42 to expose an underlying portion of the substrate 40 where the deep trench will be located.

Figure 2C:
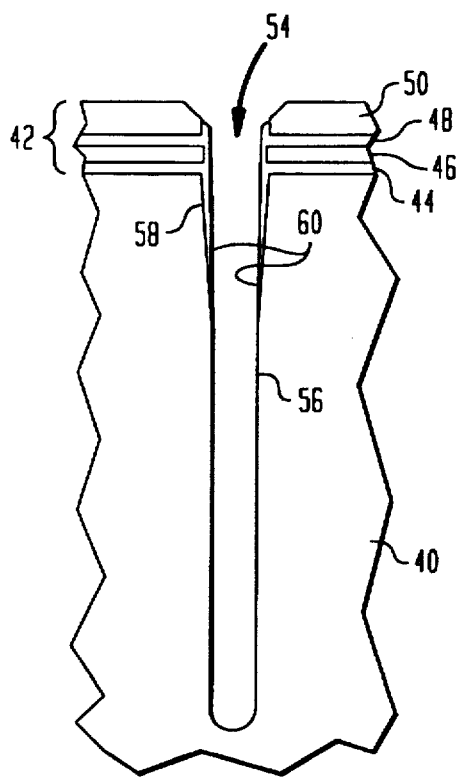
FIG. 2C is a cross-sectional side view through the substrate of FIG. 2B after deep trench etching.
Figure 2D:
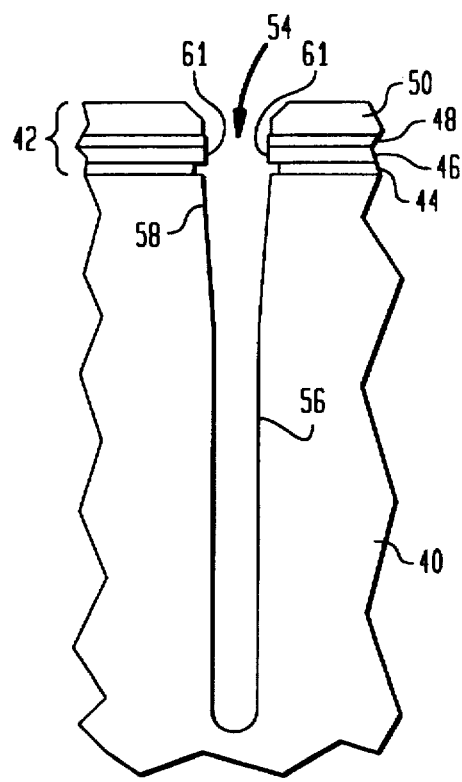
FIG. 2D is a cross-sectional side view through the substrate of FIG. 2C after sidewall passivation stripping.

In FIG. 2C, a deep trench 54 is formed in a conventional anisotropic RIE trench etch. A sidewall passivation film 60 is formed on the upper portion 58 of the trench sidewall 56 during the RIE trench etch. In FIG. 2D, the sidewall passivation film is wet chemically removed by dipping in a buffered or diluted hydrofluoric acid. The duration of the acid dip is optimized to remove substantially only the sidewall passivation film. By optimizing the acid dip to remove substantially only the sidewall passivation film, the amount of time that the pad oxide layer is exposed to the acid is relatively short. As a result, undercutting of the pad oxide layer is reduced. In practice, an undercut of about 1–6 nm occurs in the pad oxide.

Figure 2E:
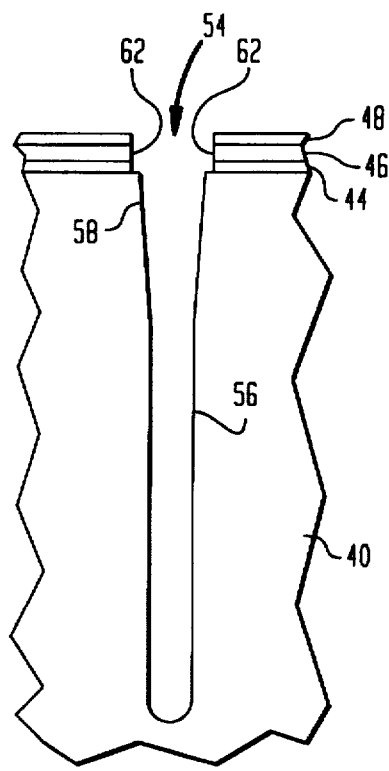
FIG. 2E is a cross-sectional side view through the substrate of FIG. 2D after pad TEOS removal.

At this stage of processing, the remaining pad TEOS layer 50 is now removed using an anisotropic process such as a dry RIE etch process. The RIE is highly selective to the material of the pad etch stop layer (i.e. etches the material of the etch stop layer at a very low rate compared to TEOS). In one embodiment, since the pad etch stop layer comprises polysilicon, the RIE is highly selective to polysilicon. The result of the RIE is depicted in FIG. 2E. Since the RIE etch process is anisotropic, only locations exposed to vertical ion bombardment are etched. No additional undercutting of the pad oxide layer 44 occurs because vertical ion bombardment is shadowed by the pad nitride layer 61. Accordingly, it is not necessary to protect the pad oxide layer 44 with a silicon plug, which is required with conventional trench formation techniques. Furthermore, the immediately following processing steps benefit from a planar surface (i.e., no TEOS topography), thereby eliminating the need for a CMP polishing step that is necessary in conventional process flow after TEOS removal.

In an alternative embodiment of the invention, the sidewall passivation film can be removed simultaneously with the remaining pad TEOS layer during the dry RIE TEOS removal process if desired, thereby eliminating the need for the buffered hydrofluoric acid dip. Consequently, undercutting of the pad oxide layer 44 can be further reduced.

Figure 2F:
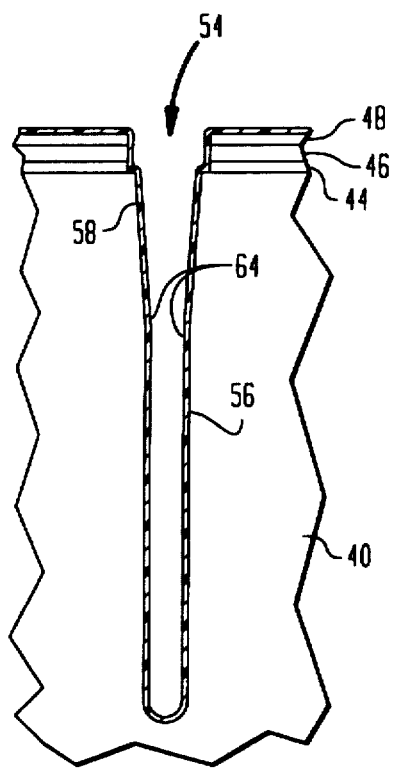
FIG. 2F is a cross-sectional side view through the substrate of FIG. 2E after node dielectric formation.
Figure 2G:
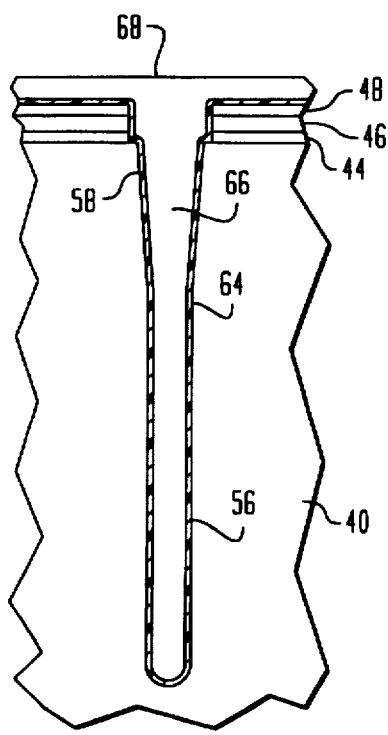
FIG. 2G is a cross-sectional side view through the substrate of FIG. 2F after trench filling with polysilicon.
Figure 2H:
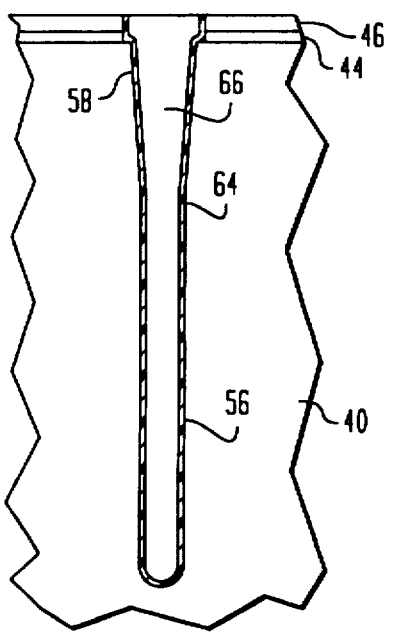
FIG. 2H is a cross-sectional side view through the substrate of FIG. 2G after CMP removal of the polysilicon pad etch stop layer.

After dry removing the pad TEOS layer, further DRAM processing can be continued. More specifically as shown in FIG. 2F, this involves forming a thin dielectric film or node dielectric layer 64 along the entire surface of the deep trench 54 using conventional thermal oxidation techniques. Referring to FIG. 2G, deep trench 54 is then filled with a polysilicon plug 66 using conventional techniques such as low pressure chemical vapor deposition. The deposition of polysilicon also forms a polysilicon layer 68. The surplus polysilicon layer 68 of the polysilicon plug 66 and the pad polysilicon layer 48 are removed by a chemical-mechanical polishing (CMP) step. Referring to FIG. 2H, the resulting structure from the CMP step is shown.

It should be understood that the embodiments described herein are merely exemplary and that a person skilled in the art may make many variations and modifications to the embodiment utilizing functionally equivalent elements to those described herein. Any and all such variations or modifications as well as others which may become apparent to those skilled in the art, are intended to be included within the scope of the invention as defined by the appended claims.

What is claimed is:

1. In device fabrication, a process for forming device structures, the process comprising:

providing a substrate of semiconductor material;

forming a mask on the substrate, the mask comprising a plurality of layers including a hard mask etch stop layer overlying the substrate, and a hard mask layer overlying the hard mask etch stop layer;

patterning the mask to define a selected region on the substrate, the patterning forming edges of the plurality of layers of the mask within the selected region;

removing a portion of the substrate in the selected region; and performing an anisotropic process to remove the portions of the hard mask layer that are not located in the selected region, the anisotropic process being selective to the hard mask etch stop layer to effectively prevent the removal of layers underlying the hard mask etch stop layer, at least part of the anisotropic process being performed when the edges of the plurality of layers of the mask are exposed.

2. A process for fabricating a capacitance storage trench for a random access memory cell, the process comprising:

providing a substrate of semiconductor material;

forming a mask on the substrate, the mask comprising a plurality of layers including a hard mask etch stop layer overlying the substrate, and a hard mask layer overlying the hard mask etch stop layer;

patterning the mask to define a selected region for forming the trench, the patterning forming edges of the plurality of layers of the mask;

removing a portion of the substrate in the selected region to form the trench;

exposing the edges of the plurality of layers of the mask;

performing an anisotropic process to remove remaining portions of the hard mask layer on the surface of the substrate, the anisotropic process being selective to the hard mask etch stop layer to effectively prevent the removal of the hard mask etch stop layer, at least part of the anisotropic process being performed when the edges of the plurality of layers of the mask are exposed;

forming a node dielectric in the trench after said anisotropic process is performed; and thereafter filling the trench with a polysilicon material.

3. The process for forming device structures as recited in claim 1, further comprising:

exposing the edges of the plurality of layers of the mask before the performing of the anisotropic process, said exposing being performed using an isotropic etch process.

4. The process for forming device structures as recited in claim 1, wherein the edges of the plurality of layers of the mask are exposed during the anisotropic process.

5. The process for forming device structures as recited in claim 1, wherein:

the plurality of layers further includes an adhesion promoting layer overlying the substrate and underlying the hard mask layer.

6. The process for forming device structures as recited in claim 5, wherein:

the anisotropic process is configured to reduce undercutting of the adhesion promoting layer.

7. The process for forming device structures as recited in claim 1, further comprising:

forming a polish stop layer overlying the substrate and underlying the hard mask layer.

8. The process for forming device structures as recited in claim 1, wherein the hard mask etch stop layer is formed of polysilicon;

the hard mask layer is formed of tetraethylorthosilicate; and the anisotropic process is a reactive ion etch process.

9. The process for forming device structures as recited in claim 5, wherein the hard mask layer is approximately in the range of 5000–7000 angstroms thick.

10. The process for forming device structures as recited in claim 9, wherein the hard mask etch stop layer is approximately 40–60 nanometers thick.

11. The process for forming device structures as recited in claim 5, wherein:
the plurality of layers further includes an adhesion promoting layer and a polish stop layer.

12. The process for forming device structures as recited in claim 5, further comprising:
applying a dielectric film to a sidewall of the trench;
overlying a polysilicon layer contiguous with the hard mask etch stop layer;
filling the trench with polysilicon to form a polysilicon plug contiguous with the polysilicon layer;
removing the polysilicon layer; and
removing the hard mask etch stop layer with the same process performed for removing the polysilicon layer.

13. The process for forming device structures as recited in claim 1 wherein the hard mask layer is formed of boron doped silicate glass.

14. The process as recited in claim 2, further comprising:
overlying a polysilicon layer contiguous with the hard mask etch stop layer and contiguous with the polysilicon material filling the trench;
removing the polysilicon layer; and
removing the hard mask etch stop layer with the same process performed for removing the polysilicon layer.

15. The process as recited in claim 14 wherein
the hard mask etch stop layer is formed from polysilicon, and
the removing of the polysilicon layer and the hard mask etch stop layer includes a chemical-mechanical polishing.

16. The process as recited in claim 2, wherein
the hard mask etch stop layer is formed of polysilicon;
the hard mask layer is formed of tetraethylorthosilicate; and
the anisotropic process is a reactive ion etch process.

17. The process as recited in claim 16, wherein the removing a portion of the substrate in the selected region to form the trench results in the formation of a sidewall passivation film on an upper portion of the trench, the process further comprising:
removing the sidewall passivation film.

18. The process as recited in claim 17 wherein removing the sidewall passivation film includes a wet chemical etch process.

19. The process as recited in claim 17 wherein the removing of the sidewall passivation film is performed during the anisotropic process for removing the hard mask etch layer.

20. In device fabrication, a process for patterning device structures, the process comprising:
providing a substrate of semiconductor material;
forming a mask on the substrate, the mask comprising a plurality of layers including a nitride layer overlying the substrate, and a hard mask layer overlying the nitride layer;
patterning the mask to define a selected region on the substrate, the patterning forming edges of the plurality of layers of the mask;
removing a portion of the substrate in the selected region;
exposing the edges of the plurality of layers of the mask within the selected region; and
performing an anisotropic process to remove the portions of the hard mask layer that are not located in the selected region, the anisotropic process being selective to the nitride layer to effectively prevent the removal of layers underlying the nitride layer, at least part of the anisotropic process being performed when the edges of the plurality of layers of the mask are exposed.

21. A process for patterning device structures, the process comprising:
providing a substrate;
forming a mask on the substrate comprising a plurality of layers including:
an adhesion promoting layer overlying the substrate;
a polish stop layer overlying the adhesion promoting layer;
a hard mask etch stop layer overlying the polish stop layer;
a hard mask layer overlying the hard mask etch stop layer;
patterning the mask to define a selected region on the substrate, the patterning forming edges of the plurality of layers of the mask in the selected region;
removing a portion of the substrate in the selected region;
exposing the edges of the plurality of layers of the mask; and
performing an anisotropic process to remove the portions of the hard mask layer that are not located in the selected region, the anisotropic process being selective to the hard mask etch stop layer to effectively prevent the removal of layers underlying the hard mask etch stop layer, at least part of the anisotropic process being performed when the edges of the plurality of layers of the mask are exposed.

22. The process as recited in claim 21, wherein
the polish stop layer is comprised of a nitride layer and approximately in the range of 200–240 nanometers thick.

23. The process as recited in claim 22, wherein:
the polish stop layer is approximately 70–120 nanometers thick; and
the adhesion promoting layer is approximately 80 angstroms thick.

24. A process for patterning device structures, the process comprising:
providing a substrate of semiconductor material;
forming a mask on the substrate, the mask comprising a plurality of layers including a hard mask etch stop layer overlying the substrate, and a hard mask layer overlying the hard mask etch stop layer;
patterning the mask to define a selected region on the substrate, the patterning forming edges of the plurality of layers of the mask;
removing a portion of the substrate in the selected region; and
prior to filling the trench with a polysilicon material, performing an anisotropic process to remove the portions of the hard mask layer that are not located in the selected region, the anisotropic process being selective to the nitride layer to effectively prevent the removal of layers underlying the nitride layer.

25. The process as recited in claim 24, wherein:
the plurality of layers includes an adhesion promoting layer overlying the substrate and underlying the hard mask layer; and the anisotropic process configured to reduce undercutting of the adhesion promoting layer.

26. The process as recited in claim 25, wherein the adhesion promoting layer is formed of oxide material.

27. A process for patterning device structures, the process comprising:

providing a substrate of semiconductor material;

forming a mask on the substrate, the mask comprising a plurality of layers including an adhesion promoting layer overlying the substrate, a polish stop layer overlying the adhesion promoting layer, a hard mask etch stop layer overlying the polish stop layer, and a hard mask layer overlying the hard mask etch stop layer;

patterning the mask to define a selected region on the substrate, the patterning forming edges of the plurality of layers of the mask within the selected region;

removing a portion of the substrate in the selected region, wherein the removing results in the formation of a sidewall passivation film on an upper portion of the trench;

performing a wet etch process to remove the sidewall passivation film, during which the adhesion promoting layer is undercut such that the edge of the polish stop layer extends into the trench further than the edge of the adhesion promoting layer; and performing an anisotropic process to remove the portions of the hard mask layer that are not located in the selected region, the anisotropic process being selective to the hard mask etch stop layer to effectively prevent the removal of layers underlying the hard mask etch stop layer.

28. The process as recited in claim 27, wherein:

the adhesion promoting layer is formed of oxide material;

the polish stop layer is formed of nitride material;

the hard mask etch stop layer is formed of polysilicon material; and the hard mask layer is formed of oxide material.

29. The process as recited in claim 27, further comprising:

applying a dielectric film to a sidewall of the trench;

overlying a polysilicon layer over the hard mask etch stop layer;

filling the trench with polysilicon to form a polysilicon plug contiguous with the polysilicon layer;

removing the polysilicon layer; and removing the hard mask etch stop layer with the same type of process performed for removing the polysilicon layer, whereby a portion of the polysilicon plug is removed such that the polysilicon plug is planarized with the polish stop layer.

30. The process as recited in claim 27 wherein at least part of the anisotropic process is performed while the edges of the plurality of layers of the mask are exposed.

* * * * *